United States Patent
Ladany et al.

[11] 3,975,555
[45] Aug. 17, 1976

[54] METHOD OF MAKING ELECTRICAL CONTACTS HAVING A LOW OPTICAL ABSORPTION

[75] Inventors: Ivan Ladany, Stockton, N.J.; Albert Chang Limm, Lancaster; James Thomas O'Brien, Leola, both of Pa.

[73] Assignee: RCA Corporation, New York, N.Y.

[22] Filed: Feb. 12, 1975

[21] Appl. No.: 549,494

[52] U.S. Cl. .................... 427/85; 357/65; 427/88; 427/91; 427/383
[51] Int. Cl.² .................................... B05D 5/12
[58] Field of Search .......... 148/186, 188, 189, 190; 427/85, 91, 88, 383; 357/65, 67, 71

[56] References Cited
UNITED STATES PATENTS

| | | | |
|---|---|---|---|
| 3,343,026 | 9/1967 | Luechinger et al. | 313/499 |
| 3,634,872 | 1/1972 | Umeda | 357/17 |
| 3,705,059 | 12/1972 | Kun | 427/85 |
| 3,733,561 | 5/1973 | Hayashi | 331/94.5 H |
| 3,850,688 | 11/1974 | Halt | 357/67 |

OTHER PUBLICATIONS

Hayashi et al. GaAS-Al$_x$Ga$_1$-As Double Heterostructure Injection Lasers In J. of App. Physics 42 (5): pp. 1929-1940 Apr. 1971.

Primary Examiner—Cameron K. Weiffenbach
Attorney, Agent, or Firm—Glenn H. Bruestle; Daniel N. Calder

[57] ABSTRACT

An electrical contact having low electrical resistance and low optical absorption is fabricated on a semiconductor electroluminescent article of III-V semiconductor material having a P-type region and an N-type region contiguous to each other, with a P-N junction therebetween. In the method of forming the contact, Zn is diffused into a surface of the P-type region opposite the PN junction. Then, a layer of gold is evaporated onto the Zn diffused surface while the device is at a temperature of approximately 400°C.

4 Claims, 1 Drawing Figure

U.S. Patent  Aug. 17, 1976  3,975,555
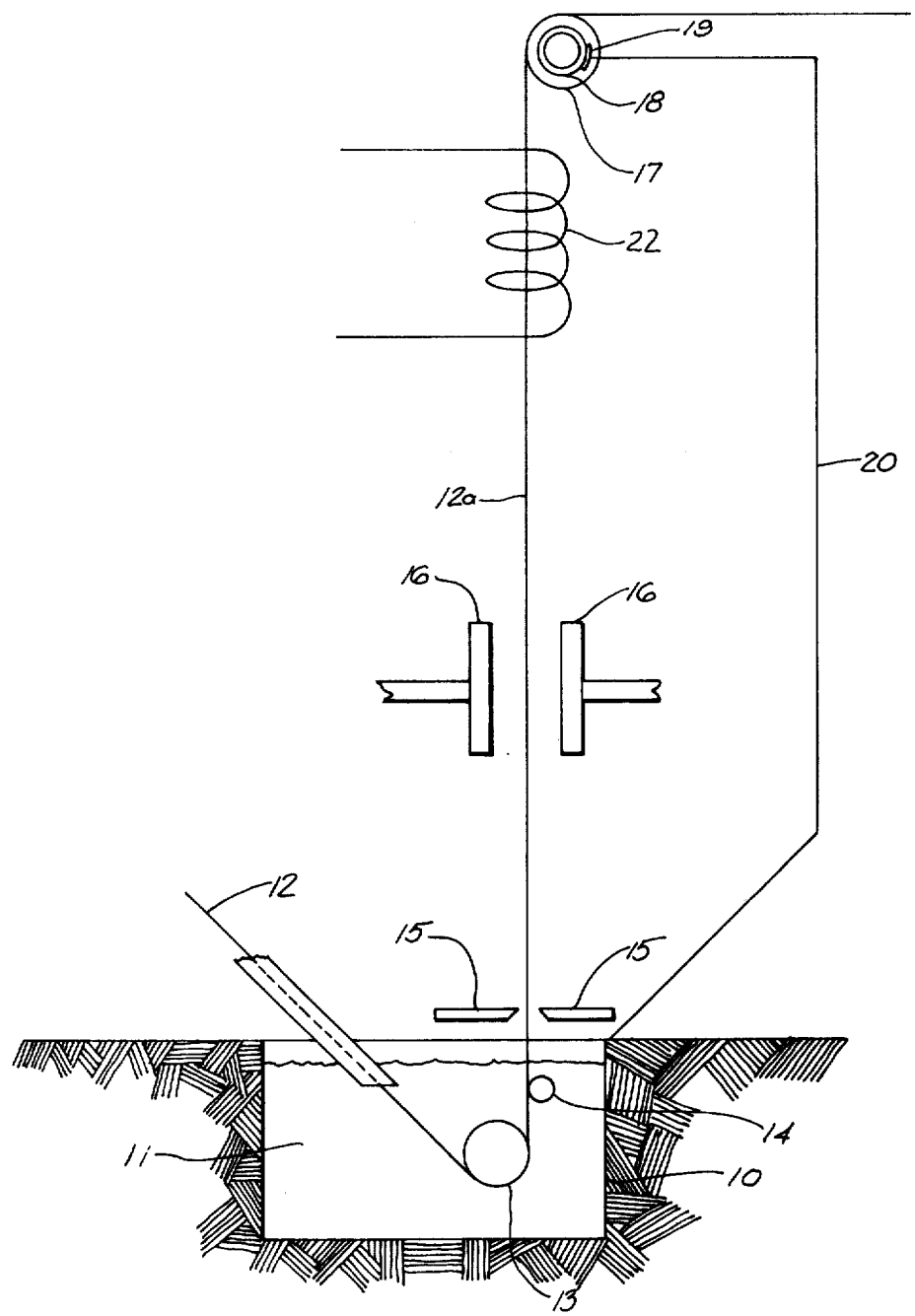

METHOD OF MAKING ELECTRICAL CONTACTS HAVING A LOW OPTICAL ABSORPTION

BACKGROUND OF THE INVENTION

The present invention relates to a method of making electrical contacts on light generating semiconductor articles and more specifically, electrical contacts which are low in electrical resistance and are low in the absorption of internally generated light.

Many electrical contacts on semiconductor articles, especially electroluminescent articles, while being low in electrical resistance are non-reflective to internally generated light. That is to say, the light incident onto the contact is absorbed by the contact reducing the possibility of such light being emitted by the semiconductor electroluminescent article. If an electrical contact is reflective to incident light, the possibility of such light eventually being emitted by the device is improved. Therefore, a method for the fabrication of electrical contacts low in electrical resistance and low in optical absorption would be most advantageous in the field of electroluminescent articles.

SUMMARY OF THE INVENTION

A method for fabricating a contact on a semiconductor article of a III-V semiconductor material, having a P-type region, wherein the contact has a low electrical resistance and low optical absorption. The method includes the steps of diffusing Zn into a surface of the P-type region of the semiconductor article, heating the article to a temperature of about 400°C. and than depositing a layer of gold on the heated article at the surface.

BRIEF DESCRIPTION OF THE DRAWING

The FIGURE of the drawing is a cross-sectional view of a semiconductor article having an electrical contact made by the method of the present invention.

DETAILED DESCRIPTION OF THE INVENTION

Referring to the drawing, a semiconductor electroluminescent article having a contact with a low electrical resistance and low optical absorption is designated as 10. The semiconductor electroluminescent article 10 includes a body 12 of semiconductor material having an N-type region 14 and a P-type region 16. The N-type region 14 and P-type region 16 are in intimate contact with each other having a P-N junction 17 therebetween. The P-type region has a surface 18 opposite the P-N junction 17. Both N-type region 14 and P-type region 16 are of a semiconductor material of the III-V group such as gallium arsenide, and may be doped with an amphoteric dopant such as silicon.

A portion of the P-type region 16, at the surface 18, is Zn doped and is herein after referred to as Zn doped layer 20. On the surface 18 of the Zn doped layer 20, is a contact 22 of gold. The contact 22 on the Zn doped layer 20 forms an electrical contact to the P-type region 16 which has low electrical resistance and low optical absorption. A contact 24 is on a surface of the N-type region 14 opposite the P-N junction 17. Typically, the contact 24 is a tin-gold alloy and occupies a small area on the N-type region 14, approximately 5% of the surface area.

In operation the semiconductor electroluminescent article 10 when electrically biased at the contacts 24 and 22 will generate light in the semiconductor body 12, through the recombination of pairs of oppositely charged carriers. Some of the light generated in the body 12 will travel in the direction of the contacts 24 and 22.

The electrical resistance of the contact 22 is low enough to give a voltage drop across the article 10, having a P-type region 16 and N-type region 14 of silicon doped gallium arsenide, of about 1.3 volts at 100 ma. The percentage of absorption for light generated in the body 12 and incident onto the contact 22 is about 30%. This low percentage of internal light absorption results in an increased light output for the semiconductor electroluminescent article 10. For example, the article 10 shows a 94% increase in light output as compared to a semiconductor device whose structure lacks the combination of a Zn doped layer 20 and a contact 22 as found in article 10, but instead contains a nickel sintered contact. Since the contact 24 occupies such a small area on the N-type region 14, even if it does absorb light incident onto it, the amount of light absorbed is inconsequential.

In the method of fabricating the contact 22, a body 12 of semiconductor material may be grown by state of the art liquid phase epitaxy techniques such as described in U.S. Pat. No. 3,565,702 "Depositing Successive Epitaxial Semiconductor Layers From the Liquid Phase", by Herbert Nelson issued Feb. 23, 1971.

The body 12 is then placed in a sealed quartz ampoule for diffusion of Zn into the body 12. An alloy of about 5% Zn by weight in gallium is also placed in the ampoule but separated from the body 12. The ampoule and its contents are heated to about 750°C for approximately 10 minutes. During this heating the Zn from the alloy is vaporized and then diffuses into the body 12. The Zn diffuses into all the exposed surfaces of the body 12, thus it becomes necessary to lap off some of the N-type region 14, so that only Zn doped layer 20 of the P-type region 16 remains. The Zn concentration in the Zn doped layer 20 is on the order of about $10^{18}$ Zn atoms per cubic centimeter. Typically, the Zn doped layer 20 is of a thin thickness, about 0.5 microns or less in thickness.

A mask is placed on a surface of the N-type region 14 opposite surface 18, so that only that portion of the surface where the contact 24 is to be formed is exposed. The masked body 12 is placed into a vacuum evaporation chamber where it is heated to a temperature of about 600°C and then a tin-gold alloy is deposited onto the exposed surface of N-type region 14, forming the contact 24. The body 12 is then repositioned in the evaporation chamber for deposition onto the surface 18 of the P-type region 16. The body 12 is heated to a temperature of about 400°C. While the body 12 is at approximately 400°C, gold is deposited onto the P-type region 16 at surface 18. The deposition of the gold forms contact 22 which is typically of about 5,000A in thickness.

It is believed that the method of the present invention is a compromise between fabrication of a contact utilizing sintering and one utilizing only evaporation of the contact onto the semiconductor body. Sintering results in an electrical contact with a low electrical resistance but high optical absorption. In sintering, a high number of recombination centers are formed at the interface of the contact and the semiconductor body resulting in the interface behaving electrically like a metal, and therefore showing the low resistance. However, sintering also results in the destruction of the crystal lattice perfection at this interface, therefore causing high optical absorption.

By merely evaporating a contact onto a semiconductor body one obtains a contact which is low in optical absoprtion but high in electrical resistance. In the evaporation process, no recombination centers are formed and the crystal structure is not disturbed, but the lack of these recombination centers at the interface of the contact and semiconductor body results in the high electrical resistivity.

In the method of the present invention, no sintering is performed but during the evaporation step, the body 12 is heated to a temperature higher than the 150°C usually required in the conventional evaporation technique. The Zn diffusion, combined with the evaporation technique, utilizing a higher temperature, results in the improved properties of the contact 22.

While in the semiconductor electroluminescent article 10 the body was of gallium arsenide, the method of the present invention for forming electrical contacts, can be used on any group III-V materials. Although the method of the present invention has been described with respect to a semiconductor electroluminescent article, it is anticipated that this method can be used ot fabricate contacts on any light generating semiconductor article. Also ot is anticipated by the method of the present invention that its utilization is not limited to P-type regions which have been silicon-doped, but can be used on P-type regions doped by any P-type impurity. Therefore, the method of the present invention can be utilized for forming electrical contacts on a semiconductor device of the III-V group, wherein the contact is to be low in electrical resistance and low in optical absorption to internally generated light. Such a contact offers an advantage in electroluminescent semiconductor devices of increasing the light output due to the fact that much of the internally generated light incident on the contact is not absorbed by the contact.

We claim:

1. A method of fabricating a contact on a semiconductor article of III-V semiconductor material having a P-type region, the contact having a low electrical resistance and low optical absorption, comprising the steps of:

diffusing Zn into a surface of the P-type region of the semiconductor article, heating the article to a temperature of about 400°C, and depositing by vacuum evaporation a layer consisting essentially of gold directly onto the surface of the heated article.

2. The method of fabrication in accordance with claim 1 wherein the Zn is diffused into the article at a temperature of about 750°C for about 10 minutes, using about a 5% by weight Zn in Ga alloy.

3. The method of fabrication in accordance with claim 2 wherein the Zn diffused into the P-type region is on the order of $10^{18}$ Zn atoms per cubic centimeters.

4. The method of fabrication in accordance with claim 3 wherein the P-type region of the semiconductor article is silicon doped.

* * * * *